US011604588B2

(12) United States Patent
Kobayashi

(10) Patent No.: US 11,604,588 B2
(45) Date of Patent: Mar. 14, 2023

(54) INFORMATION PROCESSING APPARATUS AND METHOD FOR CONTROLLING INFORMATION PROCESSING APPARATUS HAVING A SLEW RATE OF AN OUTPUT SIGNAL ADJUSTABLE THROUGH A SETTING OF IMPEDANCE

(71) Applicant: CANON KABUSHIKI KAISHA, Tokyo (JP)

(72) Inventor: Yo Kobayashi, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 157 days.

(21) Appl. No.: 17/074,294

(22) Filed: Oct. 19, 2020

(65) Prior Publication Data
US 2021/0124514 A1 Apr. 29, 2021

(30) Foreign Application Priority Data

Oct. 23, 2019 (JP) .............................. JP2019-192825

(51) Int. Cl.
G06F 3/06 (2006.01)
G06F 1/18 (2006.01)
(52) U.S. Cl.
CPC ............ G06F 3/0634 (2013.01); G06F 1/183 (2013.01); G06F 3/0604 (2013.01); G06F 3/0679 (2013.01)

(58) Field of Classification Search
CPC ........ G06F 1/183; G06F 1/185; G06F 3/0604; G06F 3/0634; G06F 3/0679; G11C 16/26; G11C 2029/4402; G11C 29/022; G11C 29/023; G11C 29/028; G11C 29/50008; G11C 29/50012; G11C 7/1069
See application file for complete search history.

(56) References Cited

U.S. PATENT DOCUMENTS

| | | | | |
|---|---|---|---|---|
| 2005/0156037 A1* | 7/2005 | Wurzburg | ........... | G06F 3/04817 235/441 |
| 2008/0169563 A1* | 7/2008 | Awano | ..................... | H01L 24/13 257/746 |
| 2011/0264826 A1* | 10/2011 | Ito | .......................... | G06F 13/385 710/14 |
| 2015/0333069 A1* | 11/2015 | Kim | ................... | H01L 27/10823 257/334 |
| 2019/0131972 A1* | 5/2019 | Gans | ................ | G11C 29/50008 |

FOREIGN PATENT DOCUMENTS

WO 2012095980 A 7/2012

* cited by examiner

Primary Examiner — Jane W Benner
(74) Attorney, Agent, or Firm — Canon U.S.A., Inc. IP Division

(57) ABSTRACT

An apparatus includes a nonvolatile semiconductor memory device storing identification information and first setting information on an output signal, a memory holding identification information of nonvolatile semiconductor memory devices, the identification information including the identification information of the nonvolatile semiconductor memory device, and setting information on an output signal associated with the identification information of the nonvolatile semiconductor memory devices, the setting information including at least second setting information on the output signal, and a processor acquiring the identification information of the nonvolatile semiconductor memory.

20 Claims, 8 Drawing Sheets

FIG.5

| PRODUCT NAME | DRIVING CAPABILITY SET VALUE |
|---|---|
| DEVICE A | 0x0 (IMPEDANCE: 50 Ω) |
| DEVICE B | 0x0 (IMPEDANCE: 50 Ω) |
| DEVICE C | 0x1 (IMPEDANCE: 33 Ω) |

INFORMATION PROCESSING APPARATUS AND METHOD FOR CONTROLLING INFORMATION PROCESSING APPARATUS HAVING A SLEW RATE OF AN OUTPUT SIGNAL ADJUSTABLE THROUGH A SETTING OF IMPEDANCE

BACKGROUND OF THE DISCLOSURE

Field of the Disclosure

The aspect of the embodiments relates to a technique for generating an optimum signal waveform by optimizing a slew rate of a signal waveform output from a nonvolatile memory.

Description of the Related Art

In recent years, a main printed circuit board (hereinafter, main board) built in an information processing apparatus, such as a personal computer (PC), is designed to be connectable to a printed circuit board (hereinafter, board) among a plurality types of printed circuit boards via a connector or cable in many cases. For example, a peripheral component interconnect express (PCIe) card slot or a dual inline memory module (DIMM) connector may be used for such a connection. This allows an end user to achieve a desired function by connecting a desired board (an integrated circuit (IC) mounted on the board) to the main board.

In such a case, since the end user connects the desired board to the main board, it is unknown what electrical characteristic the mounted IC has when electrically connected to an IC mounted on the main board.

In general, various vendors have designed and manufactured ICs in conformity with various standards, such as the Joint Electron Device Engineering Council (JEDEC). However, the electrical characteristics of the ICs slightly differ for each vendor or for each product model.

In other words, a slew rate of a signal waveform (amount of change in potential of a certain signal per unit time) may differ depending on conditions, such as an output signal driving capability of and a wiring pattern on an IC.

For example, International Publication No. WO2012/095980 discusses a memory controller including a register configured to adjust a slew rate of an address line in a stepwise manner. This technique enables accurate communications with any DIMM having a different topology of an address line.

SUMMARY OF THE DISCLOSURE

According to an exemplary embodiment of the present disclosure, an apparatus includes a nonvolatile semiconductor memory device storing identification information and first setting information on an output signal, a memory configured to hold identification information of a plurality of nonvolatile semiconductor memory devices, the identification information including at least the identification information of the nonvolatile semiconductor memory device, and setting information on an output signal associated with the identification information of the plurality of nonvolatile semiconductor memory devices, the setting information including at least second setting information on the output signal, and a processor configured to acquire the identification information of the nonvolatile semiconductor memory device, the processor being configured to acquire the second setting information, based on the acquired identification information, the processor being configured to change the first setting information of the nonvolatile semiconductor memory device, based on the second setting information.

Further features of the disclosure will become apparent from the following description of exemplary embodiments with reference to the attached drawings.

BRIEF DESCRIPTION OF THE DRAWINGS

FIG. 5 illustrates management information including a product name and an output signal driving capability set value of a nonvolatile memory.

DESCRIPTION OF THE EMBODIMENTS

Exemplary embodiments of the present disclosure will be described in detail with reference to the accompanying drawings. The following exemplary embodiments do not intend to limit the disclosure according to the claims, and all combinations of the features described in the respective exemplary embodiments are not necessarily essential configurations for the solutions of the disclosure. In the following exemplary embodiments, an image forming apparatus is exemplified as an information processing apparatus.

Figure 1:
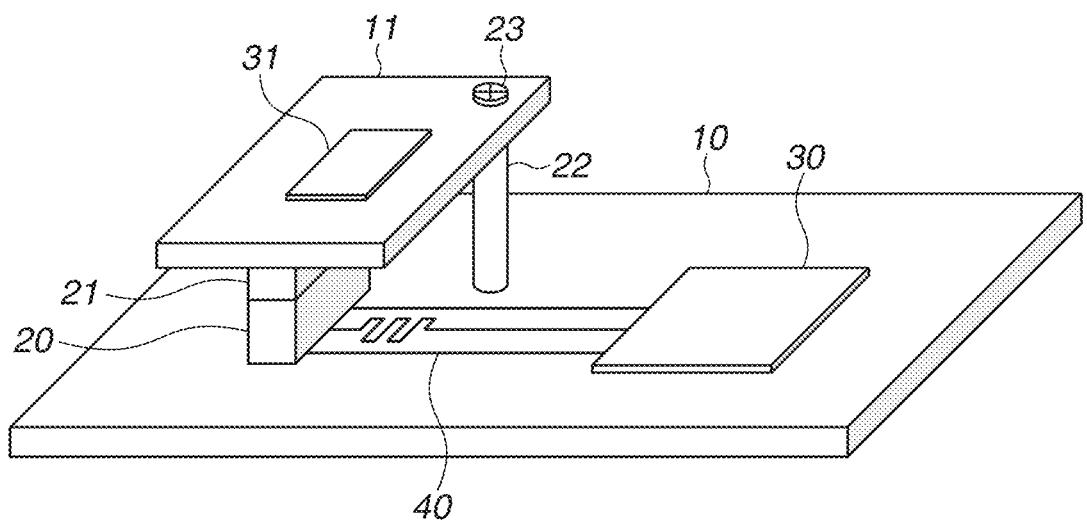
FIG. 1 is a diagram illustrating a plurality of printed circuit boards connected to each other.

According to a first exemplary embodiment, a plurality of boards is connectable. FIG. 1 illustrates a configuration consisting of a board 10 as a main board and a board 11 connected each other.

As illustrated in FIG. 1, the board 10 including a host device is connected to the board 11 including a slave device such that a connector 20 and a connector 21 are fitted together. The connector 20 is mounted on a surface of the board 10, and the connector 21 is mounted on a surface of the board 11. The connectors 20 and 21 allow passage of a plurality of signals. The board 10 is fastened to the board 11 with a spacer 22 and a screw 23 each made of a metal.

The board 10 has an integrated circuit (IC) 30 mounted thereon, and the board 11 has an IC 31 mounted thereon. The IC 30 communicates with the IC 31 via a plurality of signal lines 40. In the present exemplary embodiment, the IC 30 corresponds to the host device, and the IC 31 corresponds to the slave device.

The signal lines 40 allow passage of a data signal, a clock signal, and a command signal. The signal lines 40 establish connections between the board 10 and the board 11 via the connector 20 and the connector 21. Each line of the signal lines 40 has a specific length on the board 10 and the board 11. Since the boards 10 and 11 are provided separately, these boards are therefore interchangeable.

This board configuration achieves a desired function by connecting a board including an IC capable of implementing the desired function. This board configuration also has the following merit: for example, if the IC 30 malfunctions, the board 10 is detached from the board 11, and then a new board 10 (a board having a normal IC 30 mounted thereon) is connected to the board 11. The information processing apparatus thus becomes usable again.

In a case of designing a board to be used for an information processing apparatus, such as a PC, one of different kinds of ICs having similar functions as IC 31 may be used. In this case, parameters, such as a wiring length and resistance of a signal line mounted on the board 11 where the slave device is mounted, are not changed.

In a case, for example, where a cost of a currently used IC becomes high, replacing the IC with another IC manufactured by a different vendor can reduce the cost or realize stable business continuity planning (BCP).

As described above, the electrical characteristics of the ICs 31 are designed in conformity with a given standard. However, the electrical characteristics may differ for each vendor or for each product. When different kinds of ICs are used without changing the signal line lengths and circuit constants of the boards 10 and 11 for each characteristic of the IC 31, a device (IC 31)-dependent difference in electrical characteristic may alter a signal waveform, resulting in a communication error.

Figure 2:
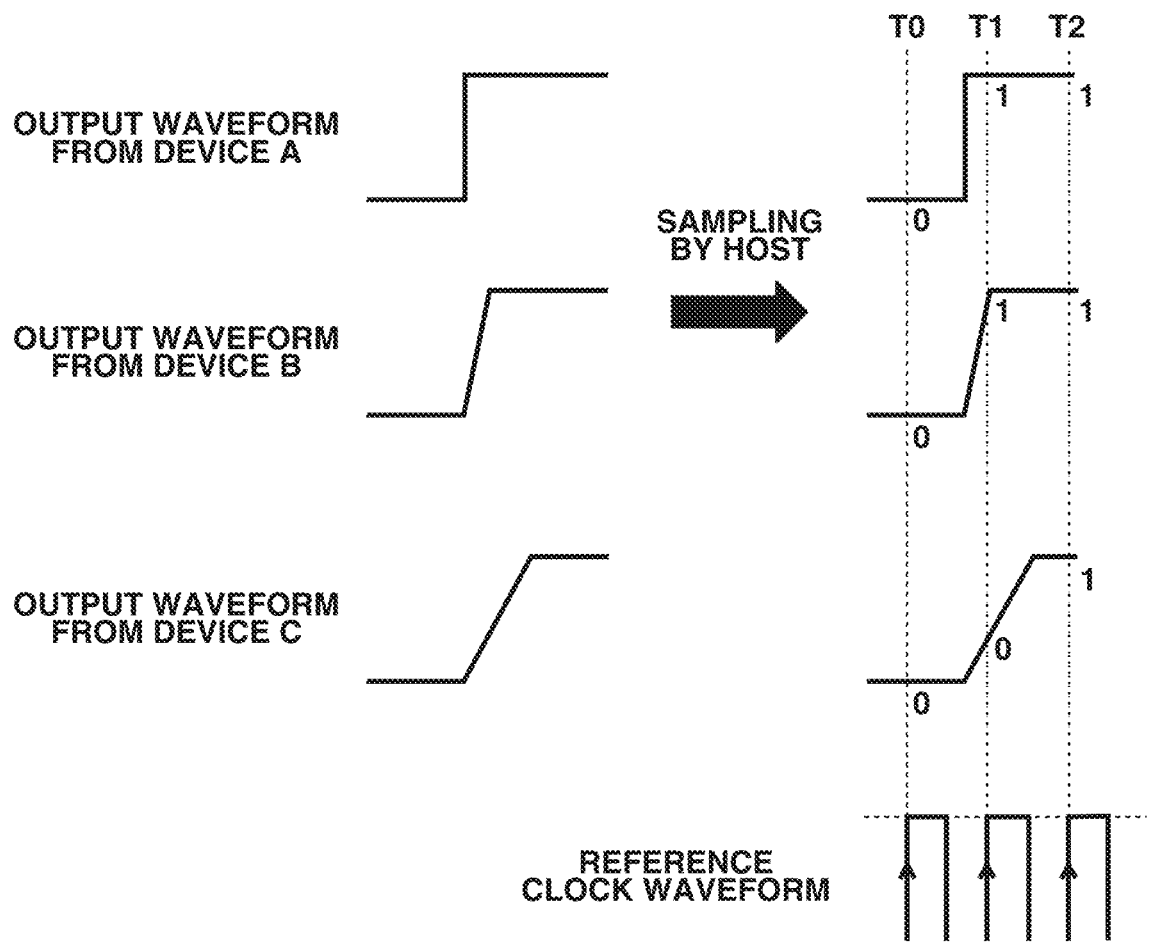
FIG. 2 is a conceptual diagram illustrating a communication error caused due to a difference in electrical characteristic among nonvolatile memories.

A specific description of such an issue will be given with reference to FIG. 2. FIG. 2 illustrates a concept of variations of slew rates occurring due to a difference in electrical characteristic among nonvolatile memories and a communication error caused by the variations.

It is assumed in FIG. 2 that three devices (device A, device B, and device C) are each prepared as the IC 31. The IC 31 transmits a bit string of 0b011 to the IC 30.

It is also assumed that the IC 31 has an initialized output signal driving capability (i.e., an initialized slew rate). Each of the devices as the IC 31 is, for example, an embedded multi media card (eMMC), which is a nonvolatile semiconductor memory, described below. The IC 30 is a central processing unit (CPU).

Although the devices A, B, and C have a same driving capability as illustrated in FIG. 2, the device C, for example, has a smaller slew rate than those of the devices A and B. As illustrated in FIG. 2, the IC 30 outputs reference clocks to the IC 31.

At time T0, each of the device A, the device B, and the device C outputs a low level. At time T1, in a case of the device A and the device B, signals output from the device A and the device B have changed from a low level to a high level when the IC 30, which is the host device, samples the bit string. With regard to the device C, however, a signal output from the device C has a low level when the IC 30, which is the host device, samples the bit string. At time T2, each of the device A, the device B, and the device C has a high level.

As illustrated in FIG. 2, the IC 30, which is the host device, correctly interprets the bit string as 0b011 in the case where the device A and the device B are used, but erroneously interprets the bit string as 0b001 in the case where the device C is used.

The reason therefor is as follows. As illustrated in FIG. 2, the signal output from the device C makes a low-to-high transition at a time T2 at which the IC 30, which is the host device, samples the bit string. As a result, the IC 30 samples the bit string as a value lower than a threshold value. At time T2, the host device thereby interprets the bit string as 0b001 in which "1" is erroneously interpreted as "0". In other words, a small gradient of a waveform during a transition (low to high, or high to low) of the signal output from the device C increases a possibility that the host erroneously interprets the signal.

Particularly in a case where the IC 30 communicates with the IC 31 in a range from several hundreds of MHz to several GHz, timing control on a picosecond (ps) order is required for the clock signals. A difference in gradient among the slew rates may cause a communication error, accordingly.

Figure 3:
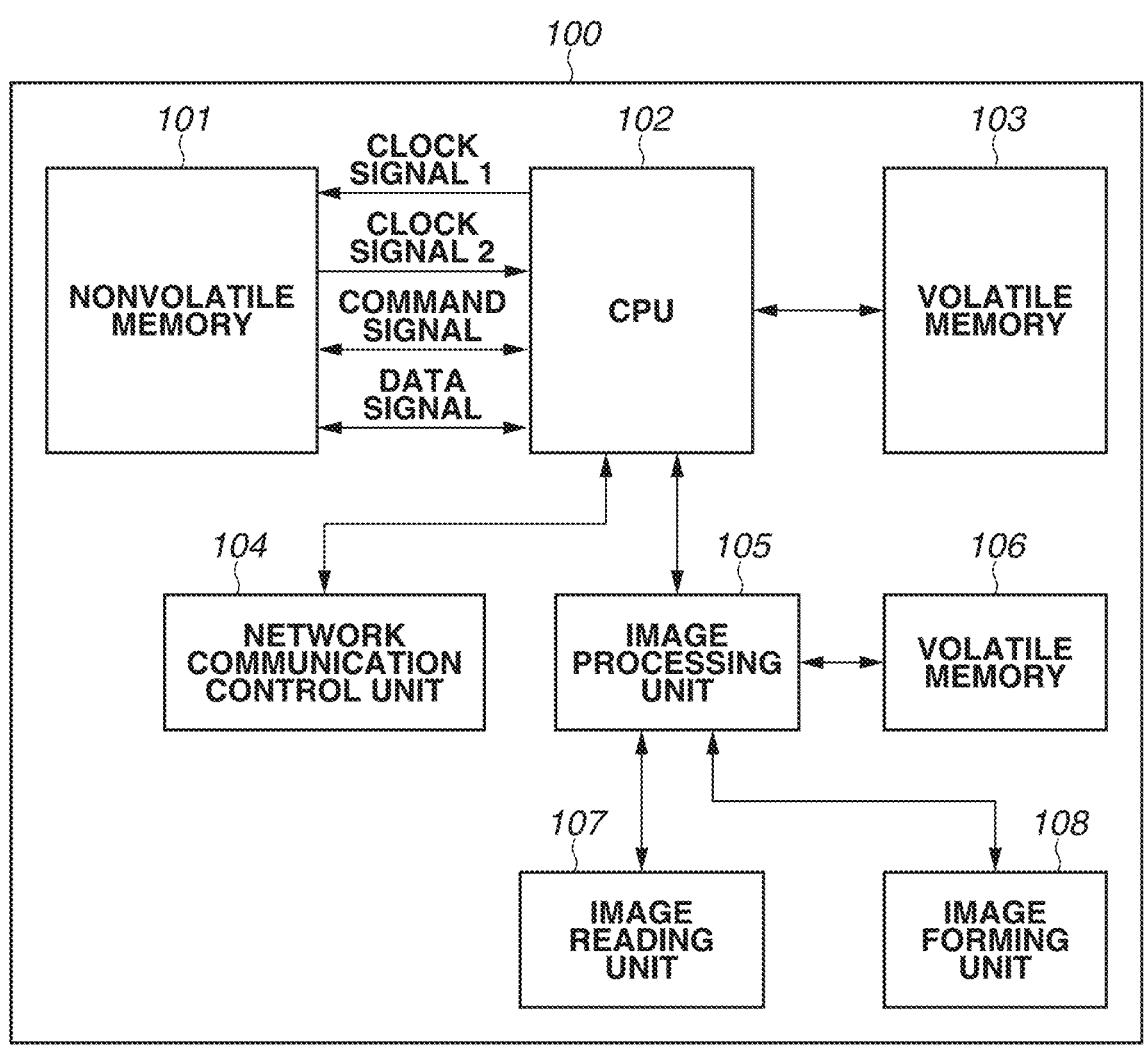
FIG. 3 is a block diagram illustrating a hardware configuration of an image forming apparatus.

A description will now be given of a hardware configuration according to the present exemplary embodiment with reference to FIG. 3.

An image forming apparatus 100 includes a nonvolatile memory 101, a CPU 102, a volatile memory 103, a network communication control unit 104, an image processing unit 105, a volatile memory 106, an image reading unit 107, and an image forming unit 108. It is assumed that, in the present exemplary embodiment, the CPU 102 corresponds to the IC 30 illustrated in FIG. 1, and the nonvolatile memory 101 corresponds to the IC 31 illustrated in FIG. 1. The image forming apparatus 100 includes two boards connected in the same manner as that illustrated in FIG. 1.

The nonvolatile memory 101 has a characteristic capable of holding data even when power supply is turned off. In the present exemplary embodiment, the nonvolatile memory 101 is an eMMC. The nonvolatile memory 101 is connected, via four buses, to the CPU 102 configured to execute various kinds of information processing in the image forming apparatus 100. One of the buses feeds a clock signal 1 from the CPU 102, which is the host device, to the nonvolatile memory 101.

An eMMC is standardized to support communications at multiple clock frequencies. In a normal operation, the clock signal 1 is used for a reference clock in communication. In contrast, an eMMC that supports a communication mode called HS400 is required to output to a host device a reference clock allowing the host device to sample data. The reference clock used in this case is a clock signal 2. The eMMC is standardized to exchange a command signal and a data signal with the host device. The command signal is used for the host device to send a request to the slave device, and is also used for the slave device to reply to the host device as to receipt of the request. Predetermined data is then output as the data signal.

A specific description will now be given of setting on the eMMC. The eMMC has a region called a card identification (CID) register, a region called a card specific data (CSD) register, and a region called an extended card specific data (EXT_CSD) register.

The CID register stores basic information (hereinafter, CID information) including a manufacturer identification (ID), and a product name.

The CSD register stores information (hereinafter, CSD information) including a maximum frequency of a clock supported by the nonvolatile memory 101 and a maximum block lead length of a clock read by the nonvolatile memory 101.

The EXT_CSD register has, for example, a register field called a DEVICE_TYPE field and a register field called an 8-bit HS_TIMING field. Transfer modes selectable in these register fields are named with a combination of numerals representing a transfer frequency and alphabets representing a sampling timing. For example, in a DDR50 mode (DDR: an abbreviation of "dual data rate"), the host device samples data at both the rising and trailing edges of a clock, and operates in a clock frequency of 50 MHz. The clock frequency is not limited to 50 MHz as long as it falls within a range specified by the Joint Electron Device Engineering Council (JEDEC).

The HS_TIMING field has an upper 4-bit driver strength region and a lower 4-bit timing interface region.

The timing interface region stores information indicating a currently set transfer mode. The driver strength region stores information on a current output signal driving capability set value. Specifically, a driving capability set value refers to information for setting an output impedance measured from a nonvolatile memory side. This set value can change output signal driving capability.

When the eMMC receives a predetermined command signal and a predetermined data signal from the host device, the eMMC accesses a target register to set the received data signal for the register.

Figure 4:
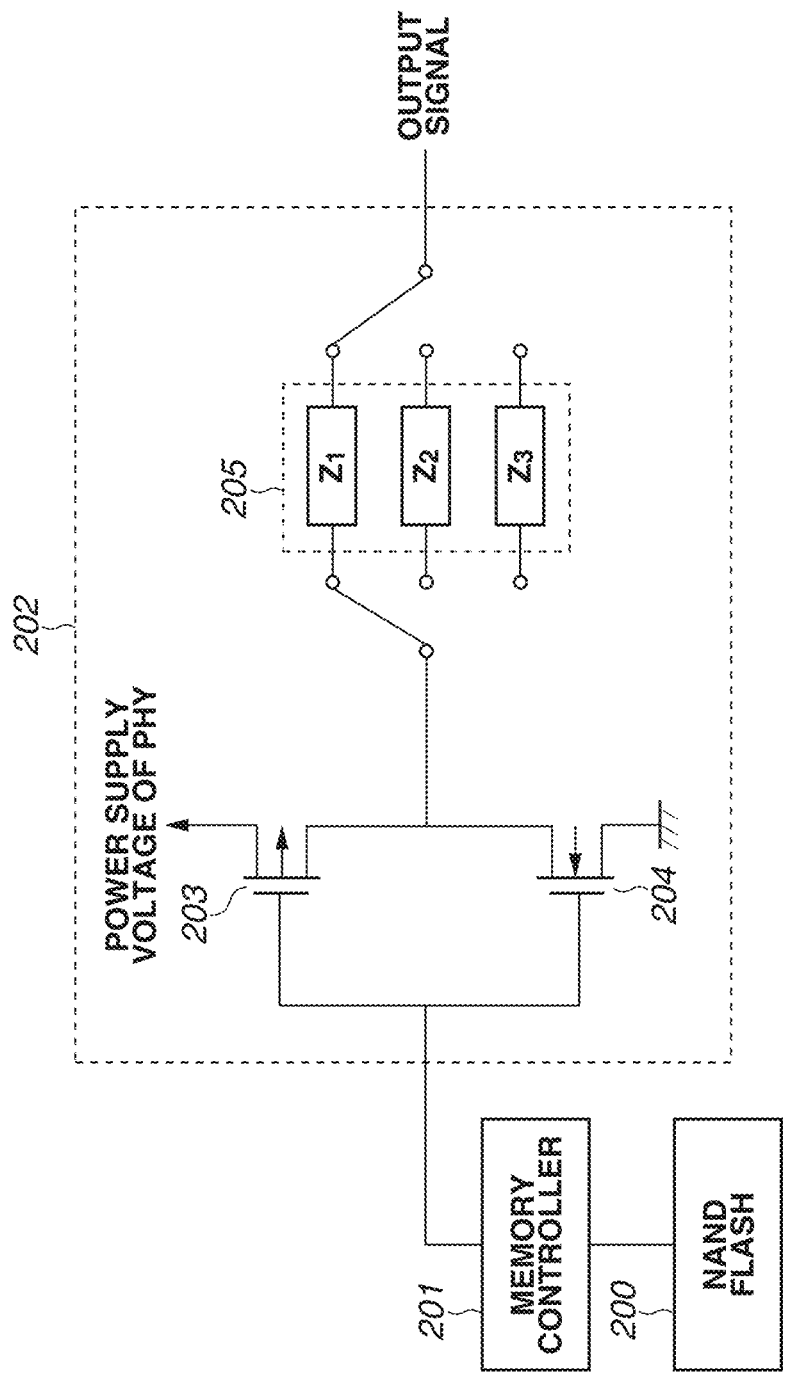
FIG. 4 is a block diagram illustrating a principle of setting an output signal driving capability of an embedded multi media card (eMMC).

A description will be given of a principle of setting the output signal driving capability of the eMMC with reference to FIG. 4. FIG. 4 illustrates an internal configuration of the nonvolatile memory 101 in a simplified manner.

The nonvolatile memory 101 includes a NAND flash memory 200. When the nonvolatile memory 101 receives a read request from the CPU 102, which is the host device, a memory controller 201 reads data from the NAND flash memory 200, and holds the data in a cache memory (not illustrated) included in the memory controller 201. The memory controller 201 transmits the data held in the cache memory to a physical layer (PHY) 202 in sequence.

A high-side field effect transistor (FET) 203, a low-side FET 204, and an impedance group 205 are disposed on the PHY 202. When the high-side FET 203 is turned on, a current flows from a power supply voltage of the PHY 202 into an output signal, so that the output signal shifts from a low to a high level. When the low-side FET 204 is turned on, a current flows from the output signal portion into the ground, so that the output signal shifts from a high to a low level.

The impedance group 205 includes an impedance Z1, an impedance Z2, and an impedance Z3 that are different in impedance value from one another. One of the impedances Z1 to Z3 is selected based on the register setting described above. In the present exemplary embodiment, the impedance Z1 has a larger impedance value than that of the impedance Z2, and the impedance Z2 has a larger impedance value than that of the impedance Z3 (Z1>Z2>Z3).

In a case where the impedance Z1, which is larger in impedance value than the impedances Z2 and Z3, is set, a small amount of current flows from the power supply voltage to the PHY 202, and a small amount of current flows into the ground. In other words, the amount of energy appearing on the output signal decreases, and thus the slew rate decreases.

In a case where the impedance Z3, which is smaller in impedance value than the impedances Z1 and Z2, is set, a large amount of current flows from the power supply voltage to the PHY 202, and a large amount of current flows into the ground. In other words, the amount of energy appearing on the output signal increases, and thus the slew rate increases.

The change in driving capability by the register setting is directed to the clock signal 2 (the frequency setting in the transfer mode), the command signal, and the data signal. Although each of the command signal and the data signal is on a two-way bus, the driving capability of a signal output from the host device to the eMMC is not changed.

The nonvolatile memory 101 stores program data, such as an operating system (OS) for controlling the image forming apparatus 100.

The nonvolatile memory 101 also stores management information in which a product name is associated with an output signal driving capability set value as illustrated in FIG. 5. An output signal driving capability set value is associated with a product name to minimize variations of output waveforms from eMMCs caused due to a difference in electrical characteristic for each vendor or for each product model.

This management information is updatable by, for example, a service engineer. In the present exemplary embodiment, a driving capability set value is associated with a product name. Alternatively, a driving capability set value may be associated with any information capable of identifying a slave device.

The CPU 102 loads the program data stored in the nonvolatile memory 101 onto the volatile memory 103, and executes processing in sequence in accordance with operation of a program counter (not illustrated) of the CPU 102. The program data contains driver software for controlling the nonvolatile memory 101. In the present exemplary embodiment, this driver software is referred to as an eMMC driver. The eMMC driver initializes the bus between the nonvolatile memory 101 and the CPU 102, issues a read command and a write command to the nonvolatile memory 101, and transmits data to the nonvolatile memory 101.

In the present exemplary embodiment, the eMMC driver reads the product name of the nonvolatile memory 101 when initializing the bus. The CPU 102 has a function of referring to the management information illustrated in FIG. 5, based on the product name, and setting the driving capability set value associated with the product name in the register in the nonvolatile memory 101. Details of the function will be described below with reference to FIG. 6.

In addition to the control on the eMMC, the CPU 102 also has, for example, a function of controlling power supply to the image forming apparatus 100 and a function of transmitting page description language (PDL) data received from the network communication control unit 104 to the image processing unit 105.

The volatile memory 103 is a dynamic random access memory (DRAM) onto which the CPU 102 loads the program data stored in the nonvolatile memory 101. The CPU 102 uses the volatile memory 103 as a working memory.

The network communication control unit 104 communicates with external equipment (not illustrated) in accordance with the Transmission Control Protocol/Internet Protocol (TCP/IP) suite to receive, for example, PDL data. It is assumed in the present exemplary embodiment that the image forming apparatus 100 is connected to the external equipment via an Ethernet cable.

The image processing unit 105 receives image data from the image reading unit 107, and subjects the received image data to image processing such as packetization, compression, and rotation. The image processing unit 105 includes a sub CPU (not illustrated), and uses the volatile memory 106 as a working memory in the image processing. The image processing unit 105 transmits the data subjected to the image processing to the image forming unit 108. The image forming unit 108 forms a desired image on a sheet of paper, using a photoconductor and toner in the image forming apparatus 100.

Figure 6:
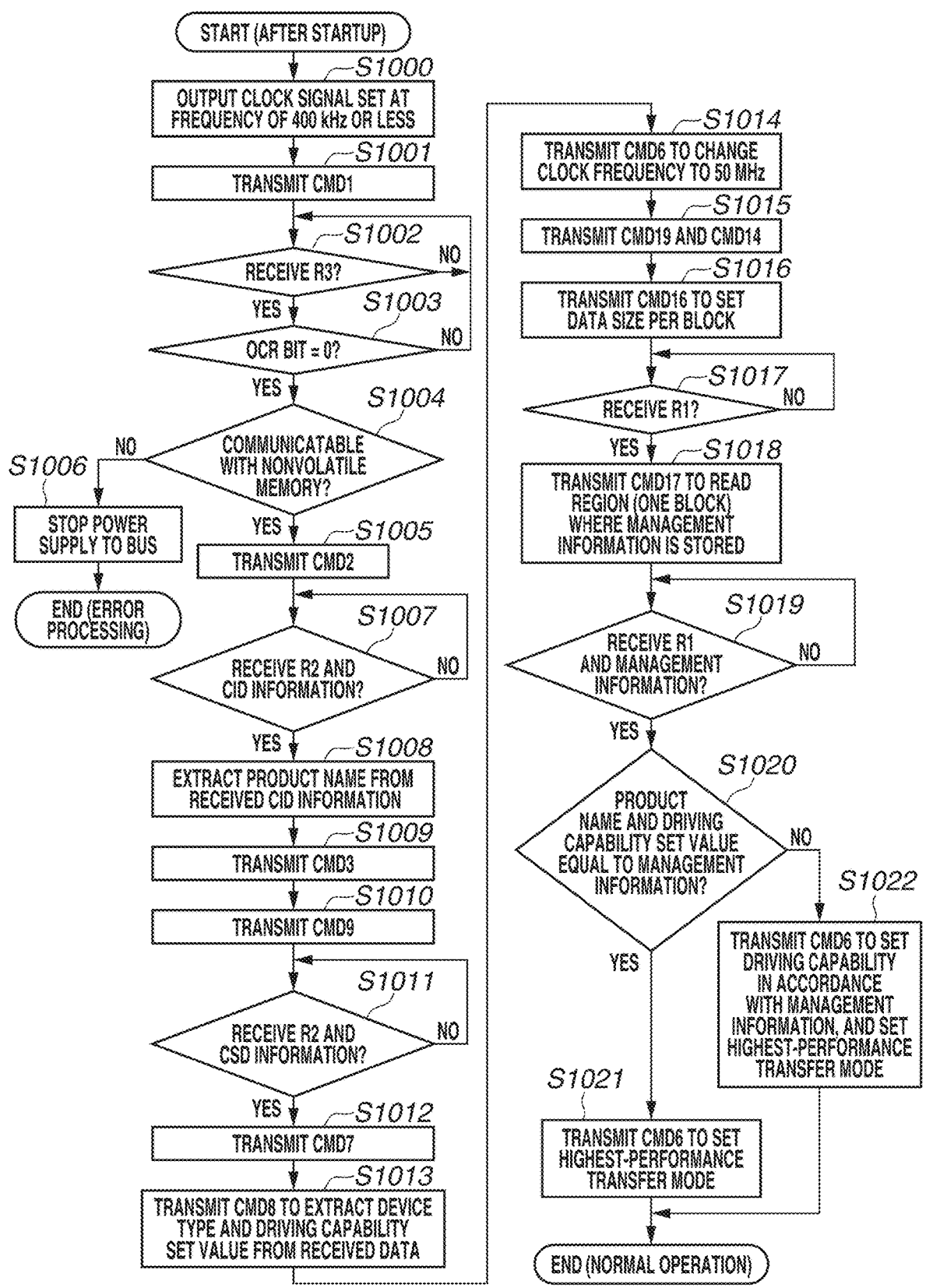
FIG. 6 is a flowchart for setting an output signal driving capability.

A processing flow for changing the output signal driving capability of the nonvolatile memory 101 performed by the CPU 102 will now be described with reference to FIG. 6. A flowchart illustrated in FIG. 6 is executed by the CPU 102.

In the following description, expressions, such as a CMDx and an Rx, are used for eMMC communication protocols specified by the JEDEC. A CMDx represents a command that the CPU 102 outputs to the nonvolatile memory 101. An Rx represents a response that the nonvolatile memory 101 outputs to the CPU 102. A CMDx and an Rx are transmitted via the command signal bus. An Rx is merely a response that is uniquely determined based on a received CMDx, and thus the description thereof will not be given. After the exchange of the CMDx and the Rx, required data is output as a data signal.

After the image forming apparatus 100 is turned on, the flowchart starts. In step S1000, the CPU 102 sets a clock signal 1 input to the nonvolatile memory 101 to a frequency of 400 kHz or less, and starts a flow for initializing the bus. In step S1001, the CPU 102 transmits a CMD1 to the nonvolatile memory 101. The CPU 102 issues the CMD1 to request transmission of information about a standard of the nonvolatile memory 101. Specifically, the CPU 102 requests transmission of information of a power supply voltage range within which the nonvolatile memory 101 is operable and information for determining whether the nonvolatile memory 101 is in a busy state.

In step S1002 after the transmission of the CMD1, the CPU 102 waits for reception of an R3, which is a response to the CMD1, from the nonvolatile memory 101.

When the CPU 102 receives the R3 (YES in step S1002), the processing proceeds to step S1003. In step S1003, the CPU 102 receives data from the nonvolatile memory 101. The CPU 102 determines whether an operation conditions register (OCR) busy bit (hereinafter, referred to as an OCR bit) in the received data is "0". The OCR bit indicates whether the nonvolatile memory 101 is in a busy state. The OCR bit of "1" indicates that the nonvolatile memory 101 is in a busy state. The OCR bit of "0" indicates that the nonvolatile memory 101 is in an idle state.

When the OCR bit is not "0" (i.e., when the OCR bit is "1") (NO in step S1003), the nonvolatile memory 101 is under process (i.e., the nonvolatile memory 101 is in a busy state), and thereby the processing cannot proceed to step S1004 and returns to step S1002. In step S1002, the CPU 102 waits for the OCR bit of R3 to become "0". When the CPU 102 determines that the OCR bit is "0" (YES in step S1003), the processing proceeds to step S1004.

In step S1004, the CPU 102 determines, from the data obtained based on the CMD1, whether the nonvolatile memory 101 is a slave device capable of communicating with the CPU 102. Specifically, the CPU 102 determines, for example, whether the nonvolatile memory 101 supports a power supply voltage supported by the CPU 102.

If the CPU 102 receives a set value that disables communication from the nonvolatile memory 101 (NO in step S1004), the processing proceeds to step S1006. In step S1006, the CPU 102 stops power supply to the bus (the PHY 202), and executes error processing. When the CPU 102 determines that the CPU 102 can communicate with the nonvolatile memory 101 (YES in step S1004), the processing proceeds to step S1005.

In step S1005, the CPU 102 transmits a CMD2 to the nonvolatile memory 101. The CPU 102 issues the CMD2 to acquire CID information, such as a manufacturer ID and a product name of the nonvolatile memory 101, from the nonvolatile memory 101 as basic information.

After the transmission of the CMD2, the CPU 102 receives an R2 from the nonvolatile memory 101 as a response to the CMD2. In step S1007, the CPU 102 waits for complete transmission of the CID information from the nonvolatile memory 101. If the CPU 102 has received all of the CID information (YES in step S1007), the processing proceeds to step S1008.

In step S1008, the CPU 102 extracts the product name from the received CID information. The product name is stored in, for example, bit numbers 103 to 56 in the CID register. This value of the product name indicates one of a device A, device B, and device C stored in the management information for setting driving capability.

In step S1009, the CPU 102 transmits a CMD3 to the nonvolatile memory 101, sets a relative card address, and shifts the nonvolatile memory 101 to a standby state. The setting of the relative card address means that the CPU 102 sets how to use an address in the nonvolatile memory 101.

In step S1010, the CPU 102 transmits a CMD9 to the nonvolatile memory 101 to acquire CSD information including a maximum frequency of a clock supported by the nonvolatile memory 101 and a maximum block lead length of a clock read by the nonvolatile memory 101. When the CPU 102 completely receives the R2 the response to the CMD2 and the CSD information (YES in step S1011), the processing proceeds to step S1012.

In step S1012, the CPU 102 transmits a CMD7 to the nonvolatile memory 101. The CPU 102 issues the CMD7 to shift the nonvolatile memory 101 in standby state shifted in step S1009 to a transfer state (a data transferable state).

In step S1013, the CPU 102 transmits a CMD8 to the nonvolatile memory 101 to acquire information stored in the EXT_CSD register. The CPU 102 extracts information about the DEVICE_TYPE field and the HS_TIMING field from the acquired EXT_CSD register information. The DEVICE_TYPE field stores transfer mode information. The HSTIMING field stores current transfer mode information and a driving capability set value. The processing then proceeds to step S1014.

In step S1014, the CPU 102 transmits a CMD6 to the nonvolatile memory 101. The CPU 102 issues the CMD6 to set a value of 0x1 in the timing interface in the HS_TIMING field of the EXT_CSD register. The CPU 102 thus changes the transfer mode of the nonvolatile memory 101 to a high speed mode (clock frequency of 52 MHz or less).

The upper 4-bit driver strength region stores a default value of the driving capability set value. The default value of the driving capability set value is, for example, 0x0. Nonvolatile memories 101 are set in a same manner for each vendor or for each product model, but are different in performance from one another although the same setting is made thereon.

In step S1015, the CPU 102 transmits a CMD19 and a CMD14 to the nonvolatile memory 101. The CPU 102 issues the CMD19 and the CMD14 to execute a test sequence for setting a bus width of a data signal. The bus width of the data signal is increasable up to 8 bits. The CPU 102 thus completes initializing the bus in the eMMC.

After the CPU 102 completes setting the bus width, the processing proceeds to step S1016. In step S1016, the CPU 102 transmits a CMD16 to the nonvolatile memory 101 to determine a data size of a block, which is a data unit in data read and in data write. The data size is, for example, 512 bytes. This data size is set to be more than or equal to a data size required for the management information. After the transmission of the CMD16, the CPU 102 waits for an R1 to be replied from the nonvolatile memory 101.

In step S1018, the CPU 102 issues a CMD17 to read the management information illustrated in FIG. 5. An address to be designated in step S1018 is a leading address of a memory region in which the management information is stored. The management information thus read is held in the volatile memory 103. After the CPU 102 issues the CMD17, the processing proceeds to step S1019 to determine whether the R1 and the management information have been received. If the CPU 102 completes the reception (YES in step S1019), the processing proceeds to step S1020.

In step S1020, the CPU 102 compares the product name extracted in step S1008 and the output signal driving capability set value extracted in step S1013, with the management information held in the volatile memory 103 in step S1019.

In step S1020, if the product name and the driving capability set value are equal to those in the management information illustrated in FIG. 5 (YES in step S1020), the processing proceeds to step S1021. If the product name and the driving capability set value are different from those in the management information illustrated in FIG. 5 (NO in step S1020), the processing proceeds to step S1022.

In step S1021, it is not necessary that the CPU 102 changes the output signal driving capability set value. Thus, the CPU 102 sets a highest-performance transfer mode among the transfer modes supported by the nonvolatile memory 101, in the lower 4-bit region of the HS_TIMING field as described above.

A specific description will be given of an exemplary case where the processing proceeds to step S1021. In the present exemplary embodiment, for example, the driving capability set value in the management information is equal to the driving capability set value of the actual device in case where the product name extracted in step S1008 is the device A. Specifically, since the default value of the nonvolatile memory 101 is 0x0, the output signal driving capability set value extracted in step S1013 is 0x0. The output signal driving capability set value illustrated in FIG. 5 (reference information) is 0x0. The CPU 102 thereby determines in step S1020 that the product name and the driving capability set value are equal to those in the management information. The processing then proceeds to step S1021.

In step S1022, the CPU 102 transmits a CMD6 to the nonvolatile memory 101 to set (overwrite) the reference information in the upper 4-bit region of the HS_TIMING field (e.g., to change a damping resistance value from 50Ω to 33Ω).

The CPU 102 obtains, from the device type extracted in step S1013, the highest-performance transfer mode supported by the nonvolatile memory 101. The CPU 102 thereby sets the transfer mode in the lower 4-bit region of the HS_TIMING field. For example, in a case where the nonvolatile memory 101 supports a transfer mode HS200, the CPU 102 sets 0x2.

Next, a specific description will be given of an exemplary case where the processing proceeds to step S1022. In the present exemplary embodiment, for example, the driving capability set value in the management information is different from the driving capability set value of the actual device, in a case where the product name extracted in step S1008 is the device C. Specifically, since the default value of the nonvolatile memory 101 is 0x0, the output signal driving capability set value extracted in step S1013 is 0x0. In contrast, the output signal driving capability set value illustrated in FIG. 5 (the reference information) is 0x1. Thus, the CPU 102 determines in step S1020 that the product name and the driving capability set value are different from those in the management information. The processing then proceeds to step S1022. In step S1022, the CPU 102 overwrites 0x0 as the default set value with 0x1 as the reference information.

Next, a description will be given of a reason why the management information is different from the default value and a reason for referring to the management information. As described above, the nonvolatile memories 101 as the devices A to C have the same default setting. The device C is equal in default value stored in the driver strength region to the devices A and B, accordingly. Under the identical setting condition, the waveforms differ for each vendor or for each product as described above. As illustrated in FIG. 2, for example, the device C having the default set value is smaller in slew rate than the devices A and B. Such a difference among the devices is grasped in advance at a time of designing the devices. In order to decrease the damping resistance value of the device C by one step to increase the slew rate of the signal, 0x1 is set in the driver strength region of the management information illustrated in FIG. 5. The driving capability set value stored in the register in the nonvolatile memory 101 is changed to the driving capability set value associated with the product name, by reference to the management information illustrated in FIG. 5, so that a desired driving capability set value is set.

A specific description will be given of an effect of improving the signal waveform with reference to a conceptual diagram of FIG. 8.

Figure 8:
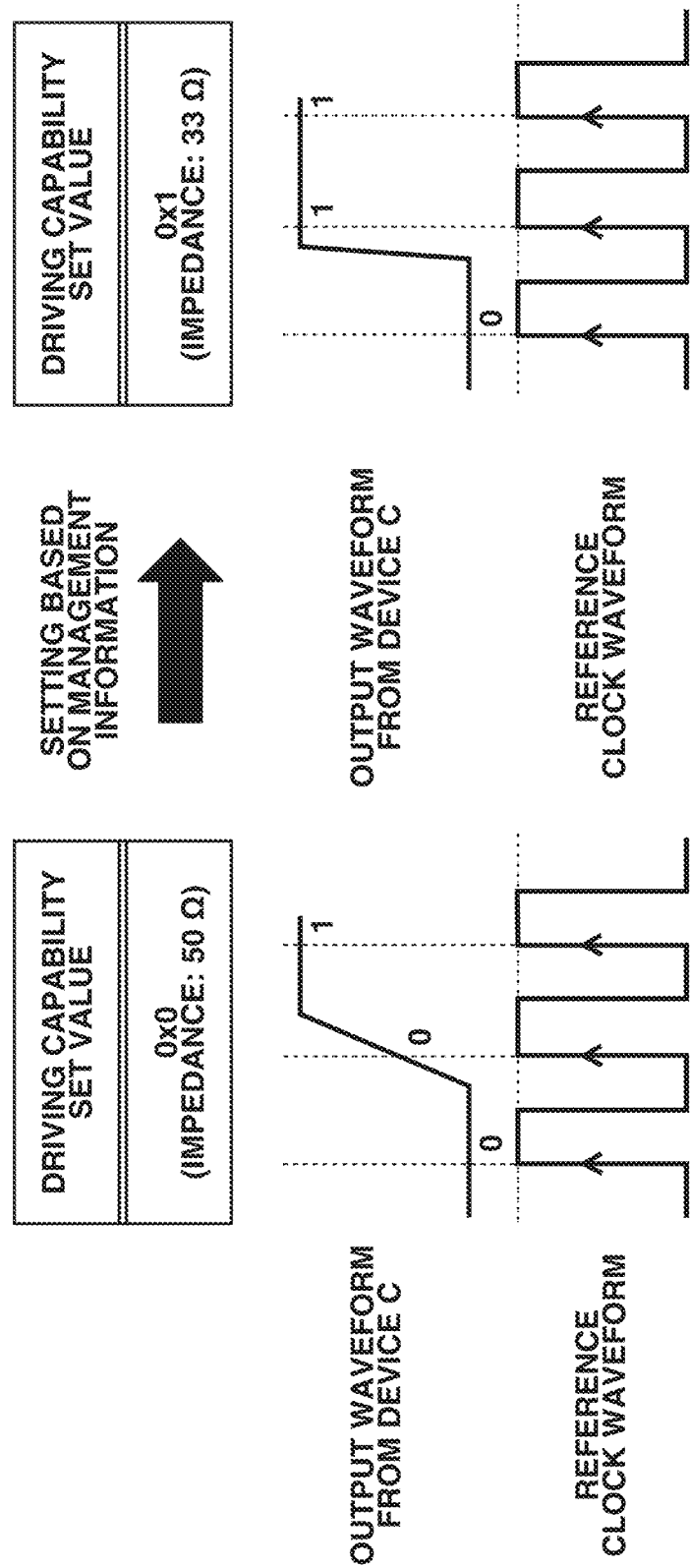
FIG. 8 is a conceptual diagram illustrating an improved signal waveform and resulting prevention of a communication error.

The output signal waveform from the device C illustrated on the left side of FIG. 8 is equal to that illustrated in FIG. 2. As described above with reference to FIG. 2, the CPU 102 erroneously recognizes the bit string of 0b011 as 0b001 in the case of the device C.

As illustrated in the right side of FIG. 8, with regard to the device C having the configuration according to the present exemplary embodiment, the CPU 102 refers to the management information illustrated in FIG. 5, and sets the driving capability set value associated with the product name for the register in the nonvolatile memory 101. The nonvolatile memory 101 (device C) thus outputs a signal waveform with a larger slew rate capable of exceeding a threshold value at a rising timing of a reference clock. The CPU 102 thereby correctly recognizes the bit string of 0b011.

If a maximum value is set for a driving capability supported by a device (if a slew rate is always maximized), a communication error is reduced, but a phenomenon of overshoot or undershoot may cause damage to an element due to an excess of the rating of the CPU 102.

The increase in driving capability may also cause an increase in amount of noise emitted from the image forming apparatus 100. In other words, it is required to set a driving capability set value in accordance with a product name.

When the processing ends, the normal startup of the nonvolatile memory 101 ends, and a normal startup of the image processing apparatus is performed.

Figure 7:
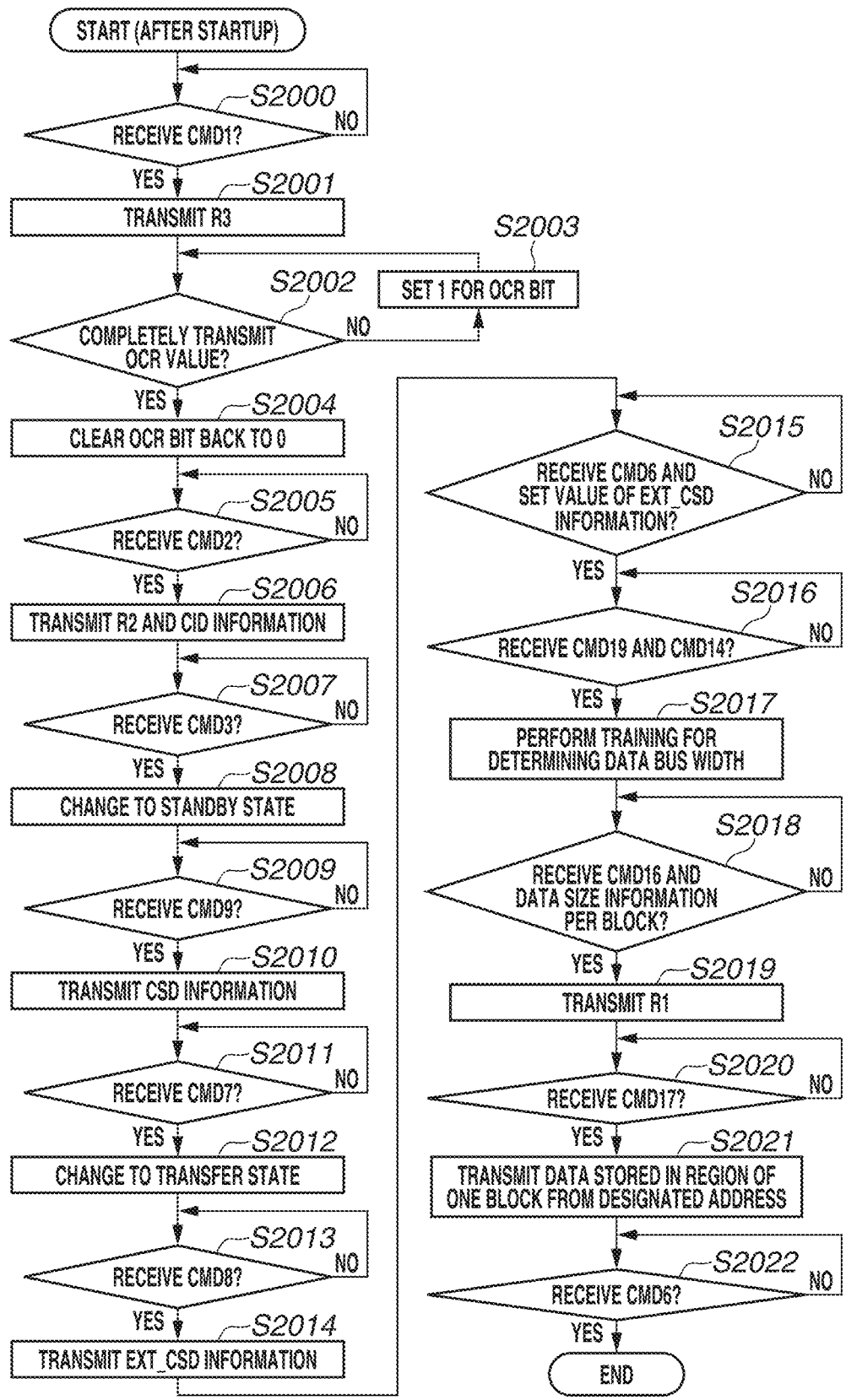
FIG. 7 is a flowchart for changing the output signal driving capability when performed by the nonvolatile memory.

Next, a description will be given of processing to be executed by the nonvolatile memory 101 with reference to a flowchart illustrated in FIG. 7. The processing illustrated in the flowchart of FIG. 7 is executed by the nonvolatile memory 101. Specifically, the processing is executed by a memory CPU included in the nonvolatile memory 101.

The nonvolatile memory 101, which is the slave device, basically transmits a response and desired data based on a command received from the CPU 102 illustrated in FIG. 6.

In step S2000, the nonvolatile memory 101 waits for reception of the CMD1 from the CPU 102. When the nonvolatile memory 101 receives the CMD1 (YES in step S2000), the processing proceeds to step S2001. In step S2001, the nonvolatile memory 101 transmits the R3 to the CPU 102 in response to the CMD1. In step S2002, the nonvolatile memory 101 transmits to the CPU 102 the OCR value storing the information, such as the power supply voltage range supported by the nonvolatile memory 101, and determines whether transmission of the OCR value has been completed.

If the nonvolatile memory 101 has not transmitted the OCR value (NO in step S2002), the processing proceeds to step S2003. In step S2003, the nonvolatile memory 101 sets 1 for the OCR bit to continue transmission of the OCR value. When the nonvolatile memory 101 has transmitted the OCR value (YES in step S2002), the processing proceeds to step S2004. In step S2004, the nonvolatile memory 101 clears the OCR bit to 0, and notifies the CPU 102 of the completion of transmission.

In step S2005, the nonvolatile memory 101 waits for reception of the CMD2. When the nonvolatile memory 101 receives the CMD2 (YES in step S2005), the processing proceeds to step S2006. In step S2006, the nonvolatile memory 101 transmits the R2 to the CPU 102 in response to the CMD2, and transmits the CID information. When the transmission of the R2 and the CID information has been completed, the processing proceeds to step S2007.

In step S2007, the nonvolatile memory 101 waits for transmission of the CMD3. If the nonvolatile memory 101 receives the CMD3 (YES in step S2007), the processing proceeds to step S2008. In step S2008, the nonvolatile memory 101 changes the operating state of the nonvolatile memory 101 to the standby state. The processing then proceeds to step S2009.

In step S2009, the nonvolatile memory 101 waits for transmission of the CMD9. If the nonvolatile memory 101 receives the CMD9 (YES in step S2009), the processing proceeds to step S2010. In step S2010, the nonvolatile memory 101 transmits the CSD information to the CPU 102.

In step S2011, the nonvolatile memory 101 waits for transmission of the CMD7. If the nonvolatile memory 101 receives the CMD7 (YES in step S2011), the processing proceeds to step S2012. In step S2012, the nonvolatile memory 101 changes the operating state of the nonvolatile memory 101 to the transfer state.

In step S2013, the nonvolatile memory 101 waits for the transmission of the CMD8. If the nonvolatile memory 101 receives the CMD8 (YES in step S2013), the processing proceeds to step S2014. In step S2014, the nonvolatile memory 101 transmits the EXT_CSD information to the CPU 102.

In step S2015, the nonvolatile memory 101 determines whether the CMD6 is received and the set value in the HS_TIMING field is designated with the data subsequent to the CMD6. At this time, the clock frequency is set at 52 MHz or less in a manner similar to that described above.

In step S2016, the nonvolatile memory 101 waits for reception of the CMD19 and the CMD14. If the nonvolatile memory 101 receives the CMD19 and the CMD14 (YES in step S2016), the processing proceeds to step S2017. In step S2017, the nonvolatile memory 101 performs training for setting the data bus width in a sequence according to the standard of the eMMC. Subsequent to step S2017, the processing proceeds to step S2018.

In step S2018, the nonvolatile memory 101 determines whether the CMD16 and information about a data size per block have been received. If the reception has been completed (YES in step S2018), the processing proceeds to step S2019. In step S2019, the nonvolatile memory 101 transmits the R1 to the CPU 102.

In step S2020, the nonvolatile memory 101 waits for reception of the CMD17. If the nonvolatile memory 101 receives the CMD17 (YES in step S2020), the processing proceeds to step S2021. In step S2021, the nonvolatile memory 101 transmits data to the CPU 102 by the data size per block determined based on the CMD16, with an address designated based on the CMD17 defined as a leading address. The data transmitted to the CPU 102 is the management information.

According to the present exemplary embodiment, the CPU 102 sets the output signal driving capability set value and the transfer mode of the nonvolatile memory 101 in steps S1016 to S1022 illustrated in FIG. 6; whereby the nonvolatile memory 101 waits for reception of the CMD6 in step S2022. If the nonvolatile memory 101 receives the CMD6, the nonvolatile memory 101 changes the driving capability set value and the transfer mode, based on the subsequent data. The processing thus ends.

The processing illustrated in FIG. 6 and the processing illustrated in FIG. 7 enable initialization of the bus between the CPU 102 and the nonvolatile memory 101 and change in setting for the output signal driving capability according to the product name of the nonvolatile memory 101.

Specifically, FIGS. 6 and 7 each illustrate the initialization processing. Steps S1016 to S1022 in FIG. 6 and step S2022 in FIG. 7 correspond to the change in output signal driving capability according to the product name of the nonvolatile memory 101.

With the above described configuration where a plurality of boards are connected to one another, a signal waveform of an optimum slew rate is generated based on an electrical characteristic of a nonvolatile memory electrically connected to a CPU, and thereby the configuration ensures communication stability.

The present disclosure has been described by way of various examples and exemplary embodiments; however, the scope of the present disclosure is not limited to the specific description.

The present disclosure may also be embodied such that a system or an apparatus receives a program implementing one or more functions in the exemplary embodiment described above, via a network or from a storage medium, and then one or more processors in a computer of the system or apparatus read and execute the program. The present disclosure may also be embodied with a circuit implementing one or more functions, such as an application specific integrated circuit (ASIC).

Other Embodiments

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-192825, filed Oct. 23, 2019, which is hereby incorporated by reference herein in its entirety.

What is claimed is:

1. An information processing apparatus comprising:
a nonvolatile semiconductor memory device storing first device information and having a slew rate of an output signal adjustable through a setting of impedance;
a memory configured to hold device information of a plurality of nonvolatile semiconductor memory devices and setting information of impedance associated with the device information on each of the plurality of nonvolatile semiconductor memory devices, the device information including at least the first device information, and the setting information including at least first setting information of the impedance associated with the first device information;
an image processing circuit configured to process image data; and
a processor configured to transmit image data to the image processing circuit,
wherein the processor is further configured to:
perform a setting for a bus that communicates with the semiconductor memory device based on startup of the information processing apparatus;
acquire the first device information from the semiconductor memory device based on completion of the setting for the bus;
acquire the first setting information of the impedance from the memory based on the first device information; and
set the first setting information for the nonvolatile semiconductor memory device.

2. The information processing apparatus according to claim 1,
wherein the processor and the memory are mounted on a first board, and
wherein the nonvolatile semiconductor memory device is mounted on a second board connectable to the first board.

3. The information processing apparatus according to claim 2, wherein the setting information is information for setting an impedance between the first board and the second board.

4. The information processing apparatus according to claim 1,
wherein the processor acquires second setting information from the nonvolatile semiconductor memory device, and
wherein the processor changes the second setting information on condition that the second setting information is different from the first setting information.

5. The information processing apparatus according to claim 4, wherein the processor determines whether the second setting information is different from the first setting information, based on startup of the information processing apparatus.

6. The information processing apparatus according to claim 1,
wherein the processor acquires the second setting information from the nonvolatile semiconductor memory device, and
wherein the processor does not change the second setting information on condition that the second setting information is equal to the first setting information.

7. The information processing apparatus according to claim 6, wherein the device information of the plurality of nonvolatile semiconductor memory devices and the setting information are read from the plurality of nonvolatile semiconductor memory devices and held in the memory, based on startup of the apparatus.

8. The information processing apparatus according to claim 4, wherein the device information of the plurality of nonvolatile semiconductor memory devices and the setting information are updatable.

9. The information processing apparatus according to claim 1, wherein the device information is a product name of the nonvolatile semiconductor memory device or a manufacturer identification of the nonvolatile semiconductor memory device.

10. The information processing apparatus according to claim 1,
wherein the nonvolatile semiconductor memory device has a plurality of transfer modes that are different in frequency from one another, and
wherein the processor sets a transfer mode at a highest frequency among the plurality of transfer modes for the nonvolatile semiconductor memory device.

11. The information processing apparatus according to claim 1, wherein a process of starting the apparatus is completed in accordance with completion of setting on the nonvolatile semiconductor memory device by the processor.

12. The information processing apparatus according to claim 1,
Wherein the setting for the bus includes setting a default value of the setting information of the impedance for the semiconductor memory device,
wherein the processor is further configured to:
acquire the first device information from the semiconductor memory device based on completion of the setting of the default value;
acquire the first setting information of the impedance from the memory based on the first device information; and
overwrite the default value of the setting information to the first setting information for the nonvolatile semiconductor memory device.

13. The information processing apparatus according to claim 1 further comprising a printer configured to form an image on a sheet,
wherein the printer form the image on the sheet based on image data processed by the image processing circuit.

14. The information processing apparatus according to claim 1, wherein the nonvolatile semiconductor memory device is an embedded multimedia card.

15. A method for controlling an information processing apparatus including an image processing circuit configured to process image data, a processor configured to transmit image data to the image processing circuit, a nonvolatile semiconductor memory device storing first device information and having a slew rate of an output signal adjustable through a setting of impedance, the method comprising:
performing a setting for a bus that communicates with the semiconductor memory device based on startup of the information processing apparatus;
acquiring the first device information from the nonvolatile semiconductor memory device based on completion of the setting for the bus;
acquiring first setting information of the impedance from a memory based on the first device information, the memory holding device information of a plurality of nonvolatile semiconductor memory devices and setting information of impedance associated with the device information on each of the plurality of nonvolatile semiconductor memory devices, the device information including at least the first device information, and the setting information including at least the first setting information of the impedance associated with the first device information; and
setting the first setting information for the nonvolatile semiconductor memory device.

16. The method according to claim 15, further comprising:
acquiring second setting information from the nonvolatile semiconductor memory device; and
changing the second setting information on condition that the second setting information is different from the first setting information.

17. The method according to claim 15, further comprising:
acquiring second setting information from the nonvolatile semiconductor memory device, and
not changing the second setting information on condition that the second setting information is equal to the first setting information.

18. The method according to claim 15, wherein the device information is a product name of the nonvolatile semiconductor memory device or a manufacturer identification of the nonvolatile semiconductor memory device.

19. The method according to claim 15, wherein a process of starting the information processing apparatus is completed in accordance with completion of setting on the nonvolatile semiconductor memory device by the processor.

20. The method according to claim 15, further comprising:
overwriting setting information of the nonvolatile semiconductor memory device, based on the first setting information.

* * * * *